United States Patent
Buckley et al.

(10) Patent No.: US 11,316,009 B2
(45) Date of Patent: Apr. 26, 2022

(54) ELECTRONIC POWER DEVICE WITH SUPER-JUNCTION

(71) Applicant: Commissariat à l'Energie Atomique et aux Energies Alternatives, Paris (FR)

(72) Inventors: Julien Buckley, Grenoble (FR); Jérôme Biscarrat, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 17/018,411

(22) Filed: Sep. 11, 2020

(65) Prior Publication Data

US 2021/0083045 A1 Mar. 18, 2021

(30) Foreign Application Priority Data

Sep. 12, 2019 (FR) ....................................... 1910069

(51) Int. Cl.
  *H01L 29/06* (2006.01)
  *H01L 27/07* (2006.01)
  *H01L 29/78* (2006.01)
  *H01L 29/872* (2006.01)

(52) U.S. Cl.
  CPC ...... *H01L 29/0634* (2013.01); *H01L 27/0727* (2013.01); *H01L 29/7806* (2013.01); *H01L 29/872* (2013.01)

(58) Field of Classification Search
  CPC ............. H01L 29/0634; H01L 29/7806; H01L 29/872; H01L 29/404; H01L 29/66204; H01L 29/66212; H01L 29/402; H01L 29/2003; H01L 29/205; H01L 29/861; H01L 27/0727
  See application file for complete search history.

(56) References Cited

U.S. PATENT DOCUMENTS

| | | | |
|---|---|---|---|
| 9,991,335 B2 | 6/2018 | Echigoya et al. | |
| 2005/0218431 A1 | 10/2005 | Nair et al. | |
| 2005/0242411 A1 | 11/2005 | Tso | |
| 2013/0126942 A1* | 5/2013 | Nakajima | H01L 29/1075 257/192 |
| 2016/0093691 A1* | 3/2016 | Echigoya | H01L 29/7393 257/76 |

(Continued)

FOREIGN PATENT DOCUMENTS

| | | |
|---|---|---|
| CN | 104617160 A | 5/2015 |
| JP | 2015-198175 A | 11/2015 |

OTHER PUBLICATIONS

Search Report as issued in French Patent Application No. 1910069, dated Apr. 29, 2020.

(Continued)

*Primary Examiner* — Sitaramarao S Yechuri

(74) *Attorney, Agent, or Firm* — Pillsbury Winthrop Shaw Pittman LLP

(57) ABSTRACT

An integrated electronic device includes a first terminal and a second terminal, a Schottky diode having a first threshold voltage and coupled between the first terminal and the second terminal, a derivation component having a second threshold voltage greater than the first threshold voltage and coupled between the first terminal and the second terminal. The derivation component comprises a super-junction.

19 Claims, 10 Drawing Sheets

(56) References Cited

U.S. PATENT DOCUMENTS

2020/0105741 A1* 4/2020 Lin .................... H01L 21/8252

OTHER PUBLICATIONS

Fujihira, T., "Theory of Semiconductor Superjunction Devices," Japanese Journal of Applied Physics, vol. 36, No. 10, Oct. 1997, XP000918328, pp. 6254-6262.

Kajitani, R., et al., "A High Current Operation in a 1.6 kV GaN-based Trenched Junction Barrier Schottky (JBS) Diode,"Extended Abstracts of the 2015 International Conference on Solid State Devices and Materials, (2015), pp. 1056-1057.

* cited by examiner

ELECTRONIC POWER DEVICE WITH SUPER-JUNCTION

CROSS REFERENCES TO RELATED APPLICATIONS

This application claims priority to French Patent Application No. 1910069, filed Sep. 12, 2019, the entire content of which is incorporated herein by reference in its entirety.

FIELD

The technical field of the invention is that of power electronics.

The present invention relates to integrated electronic circuits and in particular integrated electronic components capable of withstanding electrical overloads.

BACKGROUND

The diode is a conventional power electronics component because it enables the implementation of basic functions such as switching, rectification, voltage division, etc.

It is thus particularly beneficial in the field of power electronics that diodes have high switching speed, low resistivity in the ON state, that is to say a strong current intensity in the ON state, as well as a high breakdown voltage.

That being said, the resistivity of a diode in the ON state depends on the material of the diode which also defines the breakdown voltage of the diode. The level of voltage converted by the switching function is limited by the breakdown voltage of the diode.

Diode architectures called "MPS" (Merged PiN Schottky) diodes, or overload diodes, exist comprising a first type of diode, for example a PIN (Positive Intrinsic Negative) diode, and a second type of diode, for example a Schottky diode, coupled in parallel. This architecture enables both rapid switching between the OFF and ON states, and withstands current overloads appearing notably in transitory regime. That being said, these diodes have a high cost due to the fact that they are generally produced from a substrate made of gallium nitride (GaN).

[FIG. 1] The Japanese patent published under the number JP2015198175 describes an example of MPS diode comprising a heterojunction Schottky diode mounted in parallel with a PIN diode and of which a schematic sectional view is reproduced in FIG. 1.

A heterojunction is formed by the junction of two layers of semiconductor materials having different bandgaps. A two-dimensional electron gas forms at the interface between the two layers of semiconductor materials on account of a spontaneous polarisation and a piezoelectric polarisation. This two-dimensional gas serves as conduction channel within heterojunction electronic components, and enables high current density on account of its high charge carrier density.

The MPS diode 200 of the prior art comprises a semiconductor substrate 100, or carrier substrate, on which is produced a buffer layer 101. A buffer layer conventionally makes it possible to limit lateral and vertical leakage currents in the component and to better confine the two-dimensional electron gas at the level of the interface of the heterojunction.

The MPS diode 200 further comprises an intrinsic semiconductor layer 102, that is to say a non-intentionally doped semiconductor layer, on which the heterojunction is produced. The heterojunction comprises a gallium nitride (GaN) layer 103, an aluminium gallium nitride (AlGaN) layer 104 and a two-dimensional electron gas 106 formed at the interface between the GaN layer 103 and the AlGaN layer 104.

The Schottky diode comprises a first electrode 105 in Schottky contact with the electrons gas 106, forming the anode of the Schottky diode, and a second electrode 105' in ohmic contact with the electrons gas 106 and forming the cathode of the Schottky diode.

The PIN diode comprises a first implanted region of P type 107 produced in the gallium nitride layer 103 and forming the anode of the PIN diode, the intrinsic layer 102 and a second implanted region of N type 108 produced in the gallium nitride layer 103, in the intrinsic layer 102 and forming the cathode of the PIN diode.

According to the document JP2015198175, a solution for improving the current in the ON state of the MPS type diode 200 consists in lightly doping the intrinsic semiconductor layer 102 of the PIN diode. That being said, the increase in the doping of the intrinsic zone decreases the breakdown voltage value of the diode. Notably, from a certain doping threshold, when the doping value of the semiconductor layer 102 is multiplied tenfold, the breakdown voltage value is divided tenfold.

There thus exists a need for a diode having high a switching speed, a high current value in the ON state and a high breakdown voltage.

SUMMARY

An aspect of the invention offers a solution to the aforementioned problems by proposing an integrated electronic device enabling the passage of a high electrical current in the ON state and being able to withstand a high voltage at its terminals in the OFF state.

According to an aspect, an integrated electronic device is proposed comprising:
 a Schottky diode comprising an anode and a cathode mutually coupled by a two-dimensional electron gas and having a first threshold voltage;
 a derivation component having a second threshold voltage greater than the first threshold voltage and coupled in parallel with the Schottky diode.

According to a general characteristic of this aspect, the derivation component comprises a super-junction.

The combination of a Schottky diode and a super-junction component beneficially enables, in the absence of overload, a high switching speed, and in the presence of overload, a low resistivity in the ON state enabling the passage of a strong current. Moreover, the device conserves a very good withstand voltage since the presence of the derivation component makes it possible to avoid having to lower the withstand voltage of the diode to increase the current in the ON state.

The derivation component may be a lateral super-junction transistor comprising an insulated vertical gate, a drain and a source, the insulated vertical gate and the source being mutually electrically coupled so as to be at the same electrical potential. In an embodiment, the source is electrically connected to the anode of the Schottky diode and the drain is electrically connected to the cathode of the Schottky diode.

According to an embodiment, the device comprises an electrically conductive layer, the insulated vertical gate comprising a first vertical portion of the electrically conductive layer, the first portion being electrically insulated from the super-junction by a dielectric layer, the source of the transistor comprising a second portion of the electrically conductive layer.

The production of the source and the gate in a same electrically conductive layer is beneficial because it makes the device simpler to manufacture.

The anode of the Schottky diode may comprise the second portion of the electrically conductive layer.

Thus, on the one hand the anode of the diode and the gate of the transistor are produced in the same electrically conductive layer and on the other hand the anode of the Schottky diode and the source of the transistor are merged, which makes the device simpler to manufacture.

The device may comprise a heterojunction arranged on the super-junction and comprising a first junction layer and a second junction layer, the two-dimensional electron gas being formed at the interface between the first junction layer and the second junction layer.

The two-dimensional electron gas beneficially enables great mobility of the charge carriers and thus contributes to increasing the switching speed of the diode.

The second portion of the electrically conductive layer may form a Schottky contact with the two-dimensional electron gas, at a distance from the ends of the first junction layer.

According to an embodiment, the device comprises at least one field plate comprising a horizontal portion of the electrically conductive layer.

The production of field plates by a portion of the electrically conductive layer is beneficial because it makes the device simpler to manufacture.

According to an embodiment, the drain of the transistor comprises a heavily doped semiconductor region of a first conductivity type, the super-junction comprising a vertical stack of an alternation of semiconductor layers of the first conductivity type and of semiconductor layers of a second conductivity type opposite to the first conductivity type, the first and second layers extending horizontally from the heavily doped semiconductor region up to the insulated vertical gate.

According to an embodiment, the super-junction comprises an alternation of five first layers N type doped at a concentration of $4\times10^{18}$ cm$^{-3}$ and of five second layers P type doped at a concentration of $4\times10^{18}$ cm$^{-3}$, the first and second layers each having a thickness equal to 150 nm.

According to an embodiment, the super-junction is arranged on a voltage withstand layer of thickness equal to 3 μm and P type doped at a concentration of $1\times10^{16}$ cm$^{-3}$.

The cathode of the Schottky diode may comprise an electrically conductive layer in ohmic contact with the heavily doped semiconductor region and the two-dimensional electron gas.

According to an aspect of the invention, a method for manufacturing an integrated electronic device is proposed comprising the following steps:
  a formation of a Schottky diode comprising an anode and a cathode mutually coupled by a two-dimensional electron gas, the Schottky diode having a first threshold voltage;
  a formation of a derivation component having a second threshold voltage greater than the first threshold voltage;
  a parallel coupling of the derivation component and the Schottky diode.

According to a general characteristic of this aspect, the formation of the derivation component comprises the formation of a super-junction.

The derivation component may be a lateral super-junction transistor comprising an insulated vertical gate, a drain and a source, the insulated vertical gate and the source being mutually electrically coupled so as to be at the same electrical potential. In an embodiment, the source is electrically connected to the anode of the Schottky diode and the drain is electrically connected to the cathode of the Schottky diode.

According to an embodiment, the method comprises:
  a production of the super-junction comprising a stack of an alternation of first semiconductor layers of a first conductivity type and of second semiconductor layers of a second conductivity type opposite to the first conductivity type,
  a production of a heavily doped semiconductor region of the first conductivity type at a first end of the semiconductor layers,
  a production, on the super-junction, of a heterojunction comprising a production of a first junction layer of a first semiconductor material and a production of a second junction layer of a second semiconductor material on the first junction layer, the first and the second materials having different bandgaps so that the two-dimensional electron gas forms at the interface between the first junction layer and the second junction layer,
  a production of an insulated vertical gate at a second end of the semiconductor layers,
  a production of the anode of the Schottky diode by a formation of a first Schottky contact with the two-dimensional electron gas so that the first Schottky contact and the insulated vertical gate are mutually electrically coupled,
  a production of a second ohmic contact with the two-dimensional electron gas and the heavily doped semiconductor region.

The method may comprise a deposition of an electrically conductive layer so that the insulated vertical gate comprises a first portion of the electrically conductive layer and that the first Schottky contact comprises a second portion of the electrically conductive layer.

The method may comprise the production of at least one field plate comprising a third horizontal portion of the electrically conductive layer.

BRIEF DESCRIPTION OF THE FIGURES

The drawings are presented for indicative purposes and in no way limit the invention.

DETAILED DESCRIPTION

Figure 1:
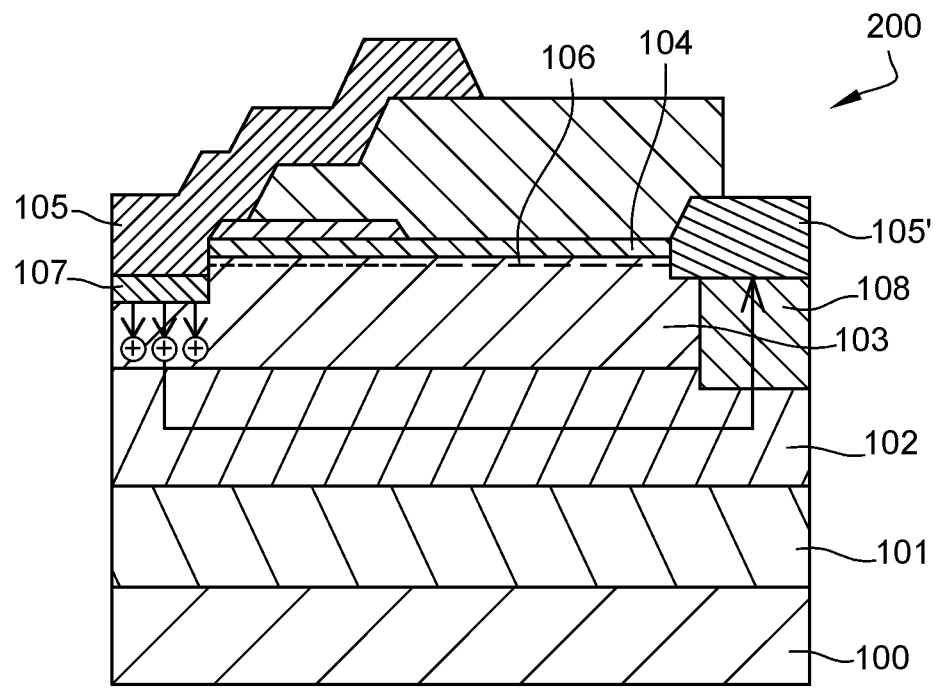
FIG. 1, described previously, illustrates the prior art.
Figure 2:
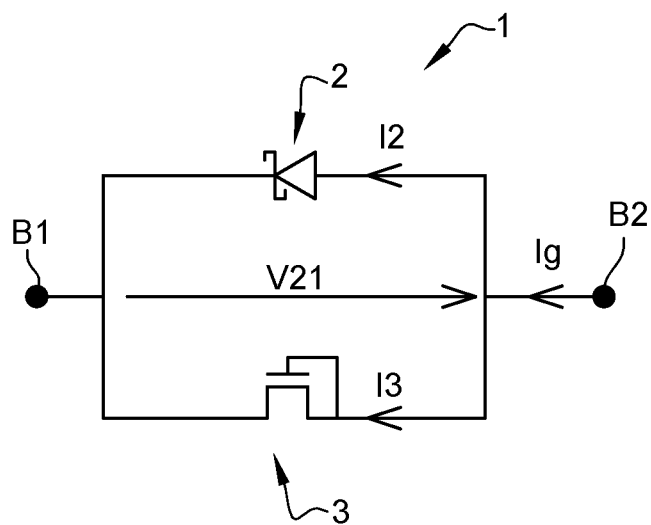
FIGS. 2 to 7 illustrate embodiments of the invention.

FIG. 2 is a schematic representation from an electrical viewpoint of an integrated electronic device 1 according to an embodiment of the invention.

The electronic device 1 is here a switch and may find applications in any sort of electronic power system, for example in a voltage step-down or in a voltage step-up.

The integrated electronic device 1 comprises a first terminal B1, a second terminal B2, a Schottky type diode 2 and a derivation component 3, the diode 2 and the derivation component 3 being coupled in parallel between the first terminal B1 and the second terminal B2. In an embodiment, the derivation component is a diode mounted transistor, that is to say a transistor of which the gate and the source are mutually electrically coupled so as to be at the same electrical potential. The source of the transistor 3 may be electrically connected to the anode of the Schottky diode 2 and the drain of the transistor 3 may be electrically connected to the cathode of the Schottky diode 2.

The diode 2 has a first threshold voltage, for example here 0.3 volts, and the transistor 3 here has a second threshold voltage greater than the first threshold voltage, for example here 1.5 volts.

Figure 3:
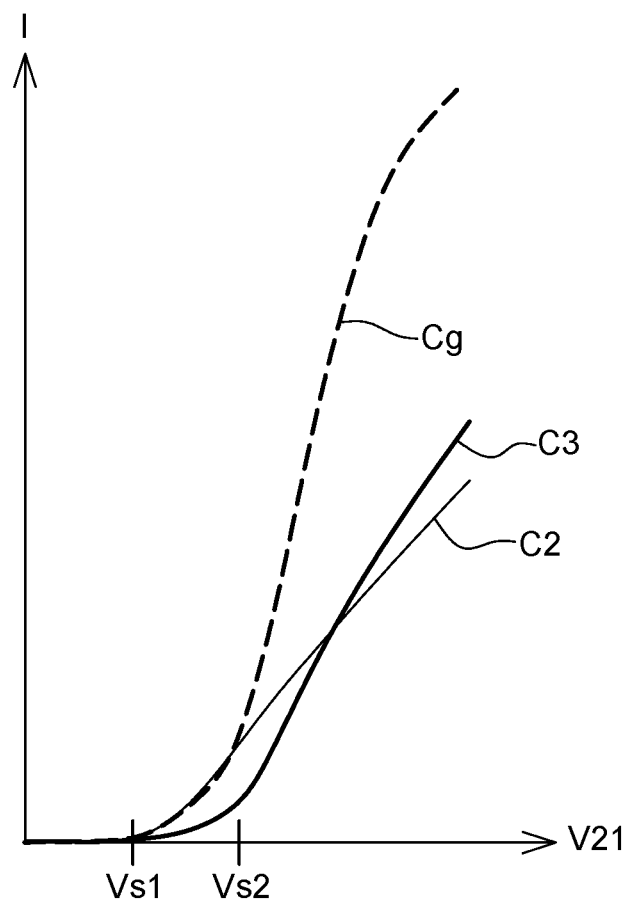

FIG. 3 represents the evolution of the intensities of currents within the device 1 as a function of the value of the voltage V21 between the first terminal B1 and the second terminal B2 of the device 1. The intensity of the current I2 through the diode 2 is represented by the curve referenced C2, the intensity of the current I3 through the transistor 3 is represented by the curve referenced C3, and the intensity of the overall current Ig circulating between the first terminal B1 and the second terminal B2 is represented by the curve referenced Cg.

In operation, when the value of the voltage V21 is positive and less than the first threshold voltage Vs1, the device is OFF and no current traverses it.

When the value of the voltage V21 is greater than the first threshold voltage Vs1 but less than the second threshold voltage Vs2, the diode 2 is ON, the transistor 3 is OFF and thus the device 1 is ON and traversed by a current which traverses the diode 2. Thus, the overall current Ig traversing the device is equal to the current I2 traversing the diode.

When the value of the voltage V21 is greater than the second threshold voltage Vs2, the diode 2 is ON, the transistor 3 is ON and the overall current Ig circulates in the device 1 through the diode 2 and the transistor 3. The overall current Ig traversing the device is equal to the sum of the current I2 and the current I3.

Thus, for high voltages, the overall current Ig traversing the device 1 is not limited by the diode 2.

When the value of the voltage V21 is negative, the diode and the transistor are in an OFF state, and no current traverses the device 1.

Figure 4:
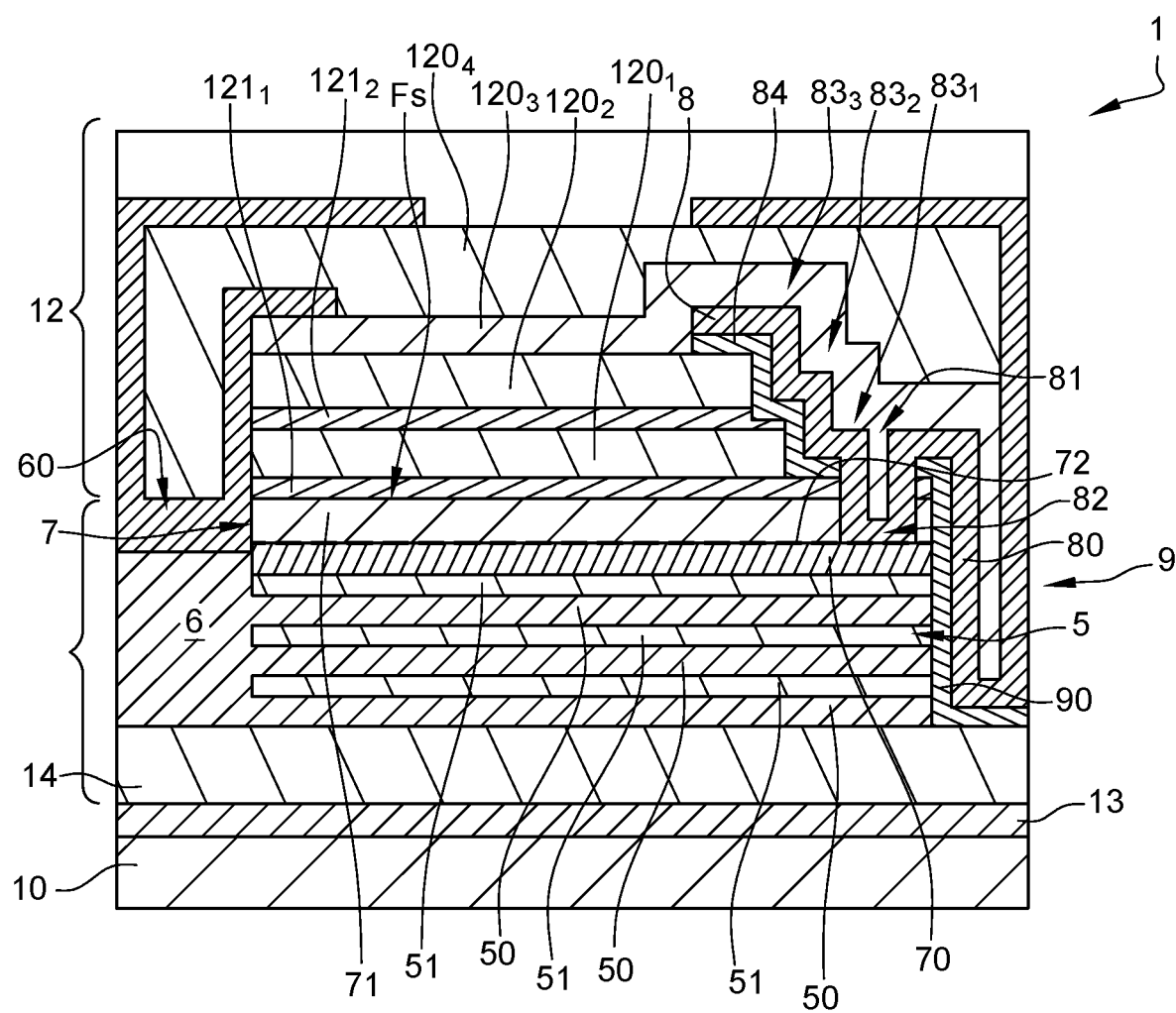

FIG. 4 is a schematic sectional view of the device 1 according to an embodiment of the invention.

The device 1 comprises a semiconductor substrate 10 supporting an active zone 11, for example a gallium nitride-based active zone. The active zone 11 comprises an upper face Fs, itself surmounted by an interconnection region 12 of which only a part is detailed here for reasons of simplification.

The substrate 10 is here a substrate made of intrinsic silicon. It could however have been possible that the substrate is a substrate made of doped silicon or an insulator substrate. The substrate could notably have been made of silicon carbide or sapphire. In the case of an active zone 11 epitaxied on silicon, the thickness of the substrate 10 is for example 1 mm for a diameter of 200 mm. The substrate 10 may however have any thickness comprised between 400 μm and 2 mm (according to its diameter).

Since the substrate 10 is made of silicon and since the active zone 11 is gallium nitride-based, the active zone 11 is beneficially separated from the substrate 10 by an adaptation layer 13 formed by epitaxy.

The adaptation layer 13 serves as intermediate between the substrate 10 and the active zone 11 and enables a lattice adaptation between the silicon of the substrate 10 and the gallium nitride of the active zone 11. It also makes it possible to absorb mechanical stresses between the substrate 10 and the active zone 11. The adaptation layer 13 conventionally comprises a layer of aluminium nitride.

Although the adaptation layer 13 is here produced in the form of a single layer, it could absolutely comprise a plurality of stacked adaptation sub-layers, and/or be produced on a nucleation sub-layer, for example a layer of aluminium nitride (AlN) in contact with the substrate. The adaptation sub-layers could comprise aluminium gallium nitride, the level of aluminium being able to vary from one sub-adaptation layer to the other.

The adaptation layer 13 is for example composed of a stack of AlN and AlGaN of 300 nm thickness.

The interconnection region 12 conventionally comprises a plurality of vias and metal tracks (not represented for reasons of simplification), as well as a superposition of first dielectric layers $121_1$, $121_2$, for example made of silicon nitride, and second dielectric layers $120_1$, $120_2$, $120_3$, $120_4$, for example made of tetraethyl orthosilicate (TEOS). This succession of dielectric layers serves as support for the production of field plates in the interconnection region, as will be seen hereafter. The layer $120_3$ also serves to encapsulate the anode during the technological production of the cathode. The layer $120_4$ also serves to encapsulate the cathode and constitutes the dielectric layer for the first level of via.

The role of the field plates is to redistribute the electric field in the device on account of the equipotential lines that they generate and thus to avoid electric field peaks, thus enabling an increase in the breakdown voltage of the device 1.

The active zone 11 comprises a voltage withstand layer 14 arranged on the adaptation layer 13, a super-junction 5 arranged on the voltage withstand layer 14 and a heterojunction 7 arranged on the super-junction 5.

The voltage withstand layer 14, for example made of P doped GaN, is dimensioned to sustain a vertical electric field which arises when the component is in the OFF state. It may be doped to $1 \times 10^{16}$ cm$^{-3}$ and have a thickness of 3 μm for a component in the OFF state at 650 V (potential of the anode=0 V, potential of the cathode=potential of the substrate=650 V).

The super-junction 5, here produced directly on the voltage withstand layer 14, comprises a vertical stack formed of a plurality of semiconductor layers, for example made of gallium nitride. The stack comprises an alternation of first layers 50 doped with a first conductivity type, here an N type conductivity, and of second layers 51 doped with a second conductivity type, here a type P conductivity.

According to this embodiment, the stack comprises three first N type semiconductor layers 50 and three second P type semiconductor layers 51.

The alternation of semiconductor layers of different conductivities beneficially makes it possible, in the case of polarisation of the device with a negative voltage V21, to generate depletion zones at the P-N junctions between the different layers of the stack.

The first and second layers 50 and 51 are beneficially stacked so that the first layer of the stack, that is to say the lower layer in contact with the voltage withstand layer 14 (P type doped) is an N type layer, and the final layer of the stack, that is to say the upper layer the furthest away from the substrate 10 and on which is produced the heterojunction 7, is a P type layer.

The order chosen for the first and second layers 50 and 51 is beneficial because it ensures that all of the first N type layers or channels 50 are surrounded by P type zones. These P type zones favour a depletion of the channels 50 in the OFF state, thus preventing the circulation of electrons in these channels.

The ratio between the thickness of the semiconductor layers 50 and 51 and the height of the depletion zones may be adapted by varying the height of the layers and/or the doping of the first and second semiconductor layers 50 and 51.

Here for example the heights of the depletion zones are equal to the thickness of the corresponding layers; the doping of the first layers 50 is $4\times10^{18}$ cm$^{-3}$ and the doping of the second layers 51 is $4\times10^{18}$ cm$^{-3}$ for a thickness of the first layers and the second layers of 150 nm.

Thus, in the case of application of a negative voltage V21, the first layers 50 and the second layers 51 are completely depleted. This beneficially enables a very good withstand voltage. Here, the device 1 withstands a voltage V21 between the first terminal B1 and the second terminal B2 equal to 650 V (when the layer 14 measures 3 µm thickness).

It could however be possible to choose any other doping value and/or any other thickness value of the first layers 50 and the second layers 51. Those skilled in the art will know how to choose the parameters adapted as a function of the envisaged applications.

The super-junction 5 further comprises a heavily doped semiconductor region 6 of the first conductivity type produced at the level of a first lateral end of the stack and which extends into the active zone along the stack so as to be in contact with the first and second layers 50 and 51 of the stack. On account of the nature of its doping, here an N type doping, the heavily doped semiconductor region 6 forms an electrical continuity with the first N type layers 50.

The heterojunction 7 is produced directly on the super-junction 5 and here comprises two superimposed semiconductor layers 70, 71, called junction layers.

A first junction layer 70 is produced directly on the stack 5, that is to say here directly on the second upper P type semiconductor layer 51, and comprises a first semiconductor material, for example non-intentionally doped gallium nitride. The first junction layer 70 is in contact with the heavily doped semiconductor region 6.

A second junction layer 71 is produced directly on the first junction layer 70 and comprises a second semiconductor material, intrinsic or lightly doped of N type (for example of the order of $2\times10^{16}$ cm$^{-3}$), here aluminium gallium nitride. The second junction layer 71 comprises the upper face Fs of the active zone 11.

The superposition of a gallium nitride layer and a aluminium gallium nitride layer is particularly beneficial here since on account of the difference in size of the bandgaps of these two materials, a two-dimensional electron gas 72 forms at the interface between the first junction layer 70 and the second junction layer 71.

The device 1 further comprises an electrically conductive layer 8, here a metal layer, which extends partially into the active zone 11 and partially into the interconnection region 12, and in particular into different levels of the interconnection region 12.

The device 1 comprises an insulated vertical gate 9 which extends along the stack of the super-junction 5 from the interconnection region 12.

The vertical gate 9 comprises an insulating vertical layer 90 of a dielectric material (for example SiO$_2$, Al$_2$O$_3$, Si$_3$N$_4$, SiN), otherwise called gate dielectric, directly in contact with the first and second layers 50 and 51, and a layer of gate material, here formed by a first vertical portion 80 of the electrically conductive layer 8.

The electrically conductive layer 8 comprises a second portion 81, for example U-shaped, extending vertically from the interconnection region 12 until horizontally contacting, that is to say by the base of the U, the first junction layer 70 at a distance from the ends of the first junction layer 70 so as to form a first Schottky type contact 82 with the two-dimensional electron gas 72.

In this embodiment, the first Schottky contact 82 is situated at a first distance from the heavily doped semiconductor region 6 and at a second distance from the insulated vertical gate 9, the first distance being clearly greater than the second distance, for example here twenty times greater. The distance between the first Schottky contact 82 and the gate dielectric 90 may be minimised in order to have the lowest resistance possible between this contact and the channel formed under the gate.

The electrically conductive layer 8 further comprises a third portion 83 extending into the interconnection region 12, and more particularly on several levels of the interconnection region 12 so as to hug the profile of the superposition of the layers of silicon nitride 121 and the layers of tetraethyl orthosilicate 120.

Here, the third portion 83 of the electrically conductive layer 8 is separated from the layers 120 and 121 by a layer of dielectric material 84.

The three sub-horizontal portions $83_1$, $83_2$ and $83_3$ thus formed by the third portion 83 of the electrically conductive layer 8 here form field plates for the device 1.

The device 1 further comprises a second ohmic type contact 60 produced in the heavily doped semiconductor region 6 so as to be in contact with the first junction layer 70. This second ohmic contact 60 establishes an electrical connection with the two-dimensional electron gas 72, with the heavily doped semiconductor region 6 and with the first layers 50.

The first Schottky type contact 82 is here coupled to the second terminal B2 and the second ohmic contact 60 is here coupled to the first terminal B1.

The diode 2 is here a Schottky type diode of which the anode comprises the first Schottky contact 82 and of which the cathode comprises the second ohmic contact 60, the anode and the cathode being coupled by the portion of the two-dimensional electron gas 72 situated between the heavily doped semiconductor region 6 and the first Schottky contact 82. The presence of the two-dimensional electron gas 72 enables great mobility of electrons in the first junction layer 70 and thus low resistance in the ON state of the diode.

The transistor 3 here comprises a drain region formed by the heavily doped semiconductor region 6 and a source region formed by the second portion 81 of the electrically conductive layer 8, and in particular by the first Schottky contact 82. The gate of the transistor 3 comprises the insulated vertical gate 9.

Thus, the first Schottky contact 82 is here a double contact since it forms a contact for the anode of the diode 2 and for the source of the transistor 3.

Since the gate material is formed by the first vertical portion 80 of the electrically conductive layer 8 and since the source is formed by the second portion 81 of the electrically conductive layer 8, the source and the gate of the transistor 3 are mutually electrically coupled so as to be at the same electrical potential and the transistor 3 is thus diode mounted.

Thus, in operation, when the voltage V21 between the first terminal B1 and the second terminal B2, that is to say between the first Schottky contact 82 and the second ohmic contact 60, is negative, then the diode 2 and the transistor 3 are OFF, and in particular the first layers 50 and the second layers 51 are completely depleted. No current circulates between the first terminal B1 and the second terminal B2.

When the voltage V21 between the first terminal B1 and the second terminal B2 is positive but less than the first threshold voltage, that is to say the conduction threshold of the diode, the diode 2 and the transistor 3 are OFF, and in particular the polarisation of the vertical gate 9 is insufficient for the creation of an inversion zone in the second semiconductor layers 51. No current circulates between the first terminal B1 and the second terminal B2.

Figure 5:
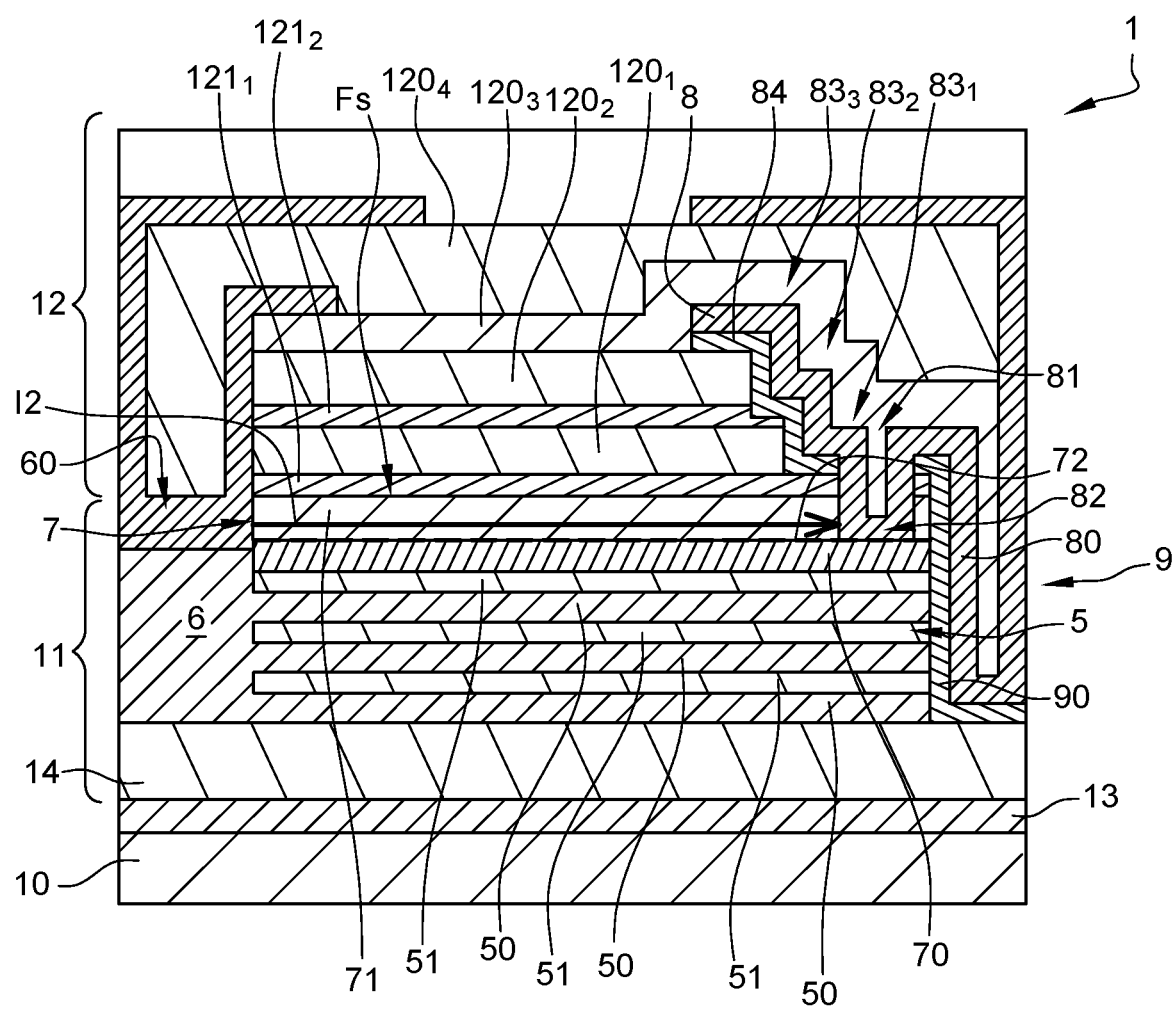

[FIG. 5] As illustrated in FIG. 5, when the voltage V21 is greater than the first threshold voltage Vs1 and less than the second threshold voltage Vs2, that is to say less than the conduction threshold of the transistor 3, then the diode 2 becomes ON and current I2 circulates between the first terminal and the second terminal via the two-dimensional electron gas 72. Since the voltage V21 is less than the threshold voltage of the transistor, the polarisation of the gate 9 is insufficient for the creation of an inversion zone in the second semiconductor layers 51. The transistor is thus OFF.

Figure 6:
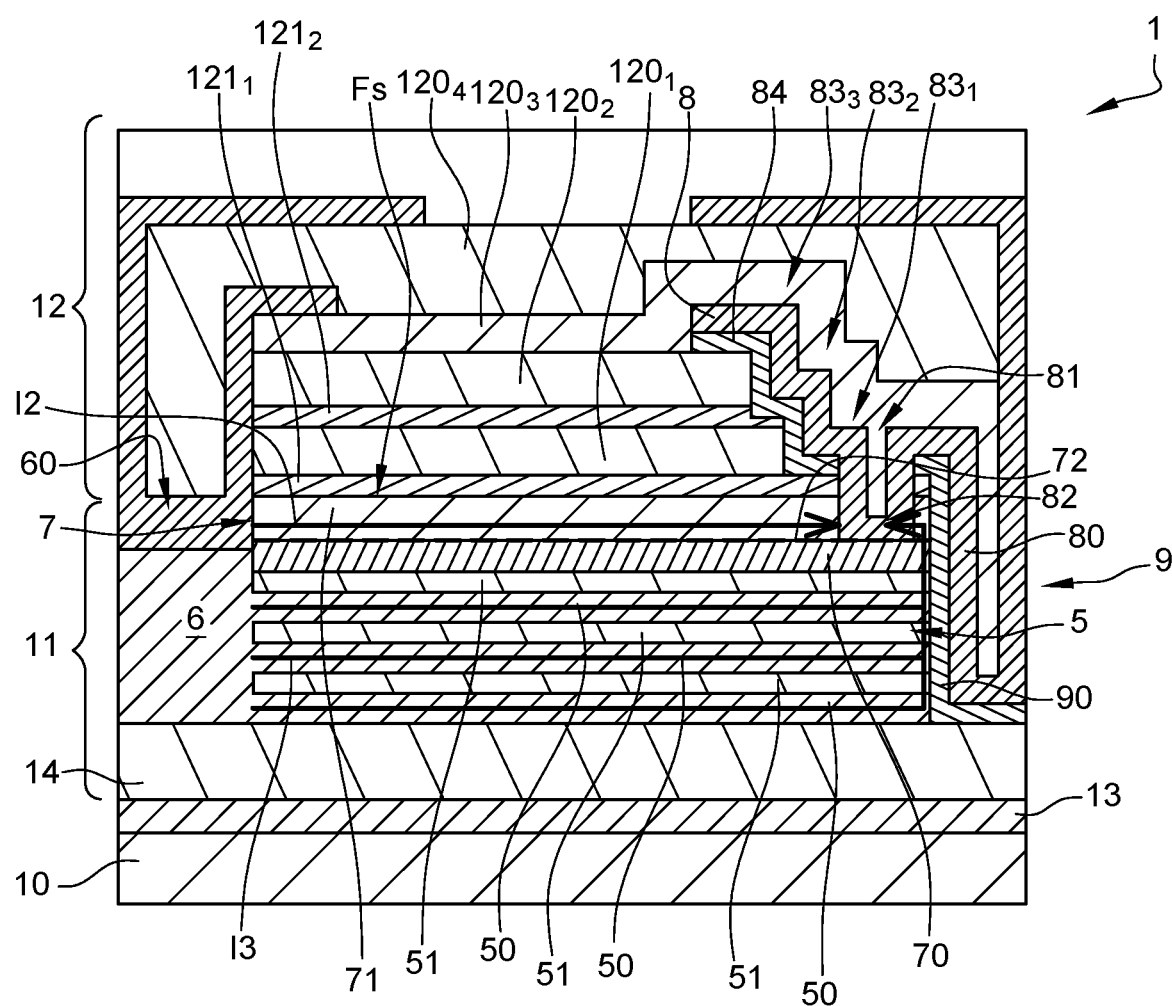

[FIG. 6] As illustrated in FIG. 6, when the voltage V21 is greater than the second threshold voltage Vs2, that is to say when an overload arises between the first terminal and the second terminal, then the diode 2 and the transistor 3 are ON. In particular, an inversion zone is created in the second semiconductor layers 51 along the vertical gate 9 and current I3 circulates between the first terminal B1 and the second terminal B2 along the first semiconductor layers 50, along the insulated vertical gate 9 through the channel formed by the inversion zones in the second semiconductor layers 51, and in the portion of the two-dimensional electron gas 72 situated between the vertical gate 9 and the first Schottky contact 82.

Thus, the device 1 enables circulation of a strong current between its terminals by making the overload circulate through the transistor 3

Although an integrated electronic device in which the super-junction comprises three first N type semiconductor layers has been described, it could be entirely possible that the super-junction comprises a different number of first semiconductor layers, beneficially comprised between 1 and 10.

Figure 7:
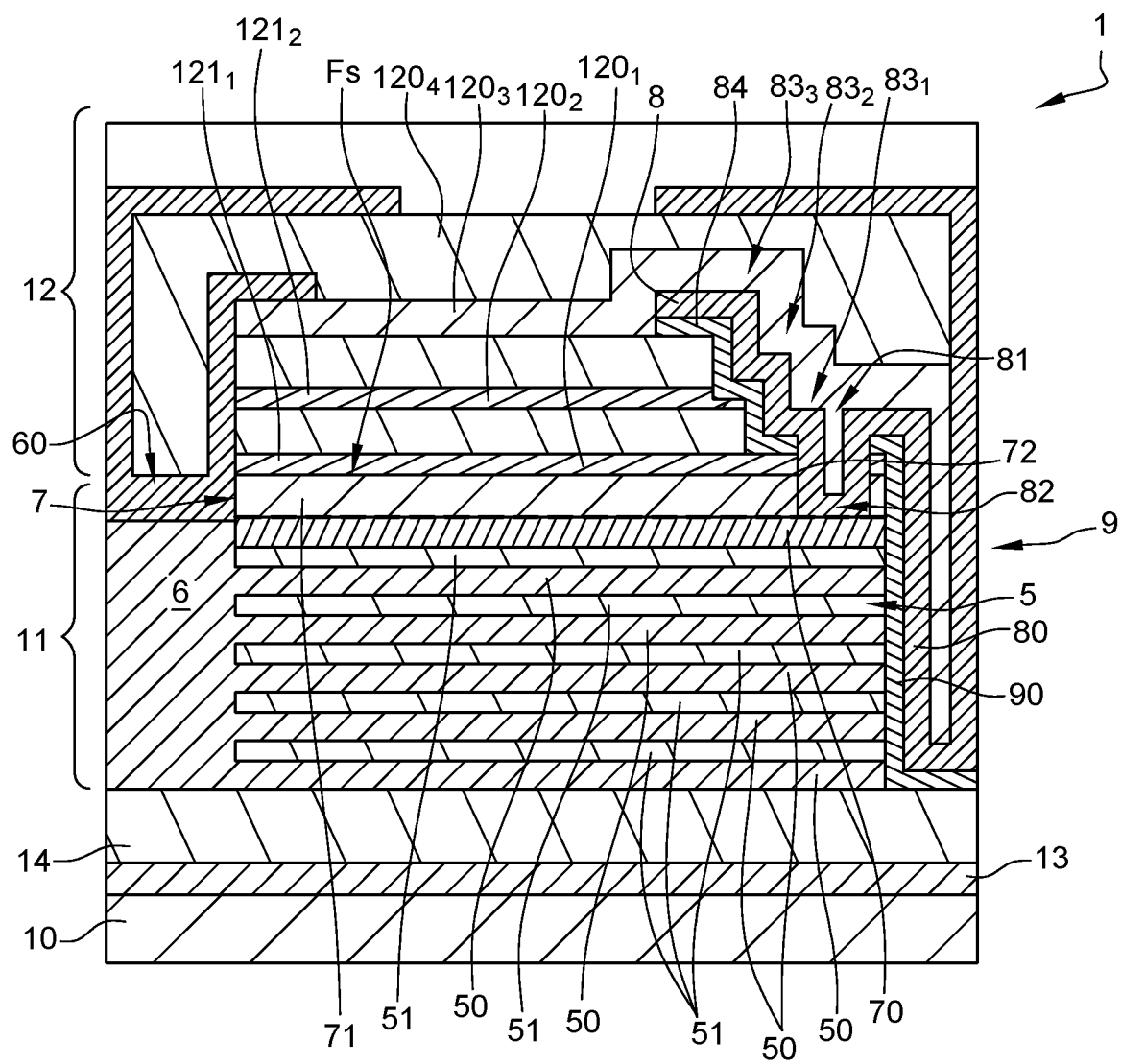

[FIG. 7] Thus, as illustrated in FIG. 7, the device 1 may comprise a super-junction comprising 5 first semiconductor layers 50 and 5 second semiconductor layers 51.

FIGS. 8 to 14 illustrate different steps of a method for manufacturing a device 1 according to an embodiment of the invention.

Figure 8:
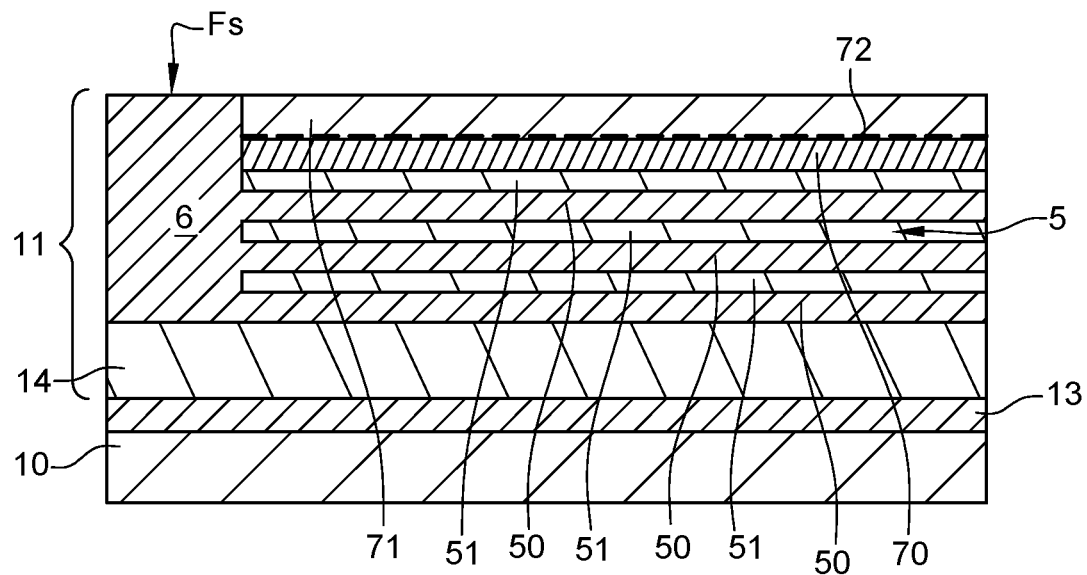
FIGS. 8 to 14 illustrate a method for manufacturing a device according to an embodiment of the invention.

[FIG. 8] According to a first step of the manufacturing method illustrated by FIG. 8, the active zone 11 is produced on the semiconductor substrate 10 and the adaptation layer 13.

The production of the active zone 11 comprises a production of the voltage withstand layer 14 on the adaptation layer 13 and a production of the super-junction 5 on the voltage withstand layer 14, by successive production of the first semiconductor layers 50 and the second semiconductor layers 51. The voltage withstand layer 14, the first semiconductor layers 50 and the second semiconductor layers 51 are here produced by epitaxy of gallium nitride.

The production of the super-junction 5 further comprises the production of the heavily doped semiconductor region 6. The production of the region 6 may comprise an implantation of N type dopants at high energy directly in the first semiconductor layers 50 and in the second semiconductor layers 51, at the level of an end of the stack of the first and second semiconductor layers 50 and 51.

In an alternative, it could have been possible to produce the heavily doped semiconductor region 6 by production of a trench in the stack of first and second semiconductor layers 50 and 51 then by filling the trench by an N type semiconductor material, for example gallium nitride.

The production of the active zone 11 further comprises the production of the heterojunction 7 on the super-junction 5. The production of the heterojunction 7 comprises a production of the first junction layer 70, here by deposition of a layer of non-intentionally doped gallium nitride directly on the super-junction 5, and a production of the second junction layer 71, here by deposition of a aluminium gallium nitride layer directly on the first junction layer 70.

Once the heterojunction 7 has been produced, the two-dimensional electron gas 72 forms at the interface between the first junction layer 70 and the second junction layer 71.

Figure 9:
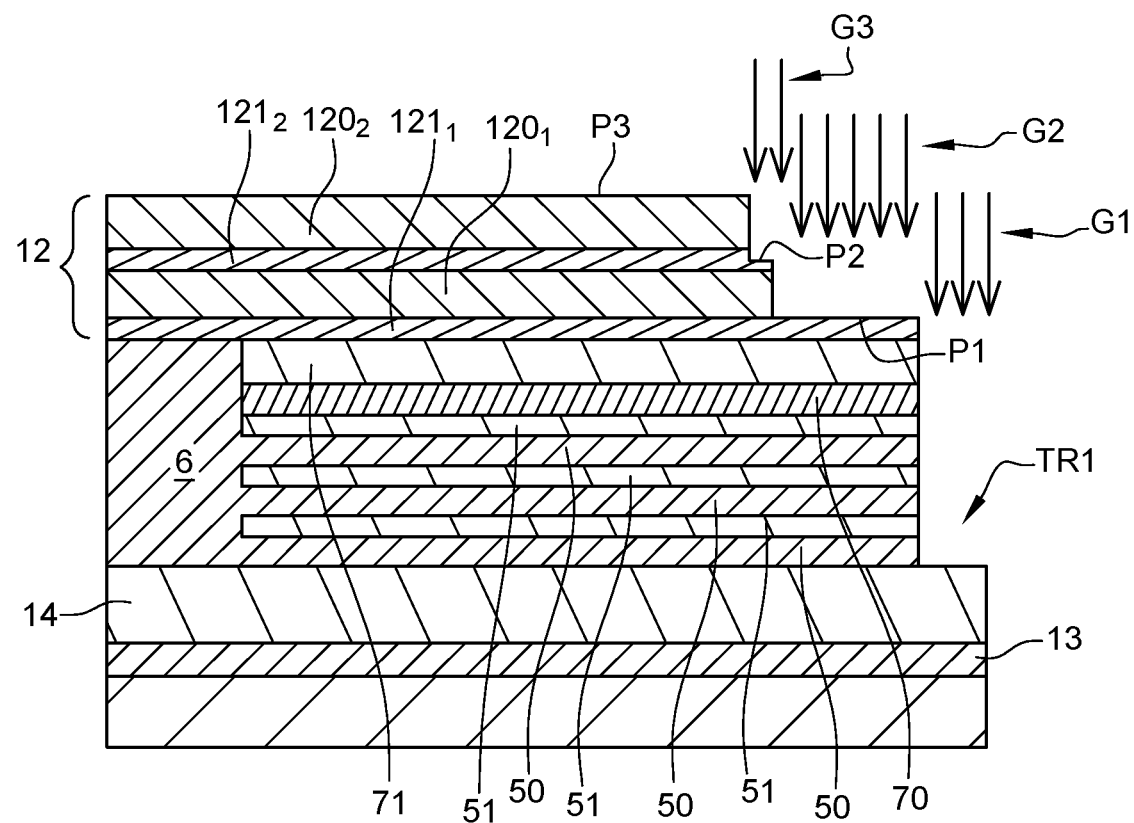

[FIG. 9] As illustrated in FIG. 9, the method comprises the production, in the interconnection region 12, here directly on the second junction layer 71, of a stack of a first layer of silicon nitride $121_1$, a first layer of TEOS $120_1$, a second layer of silicon nitride $121_2$ and a second layer of TEOS $120_2$, followed by three successive etchings G1, G2 and G3 so as to define a support profile for the later deposition of the electrically conductive layer 8.

A first etching G1 is here carried out through the layers of silicon nitride $121_1$ and $121_2$, layers of TEOS $120_1$ and $120_2$, and first and second layers 51 and 52 of the super-junction 5 down to the voltage withstand layer 14 so as to form a first trench TR1.

A second etching G2 is carried out through the second layer of TEOS $120_2$, the second layer of silicon nitride $121_2$ and the first layer of TEOS $120_1$ down to the first layer of silicon nitride $121_1$ so as to define a first stage P1 in the interconnection region 12.

A third etching G3 is carried out through the second layer of TEOS $120_2$, and through a part of the second layer of silicon nitride $121_2$ so as to define a second stage P2 and a third stage P3 in the interconnection part 12.

Figure 10:
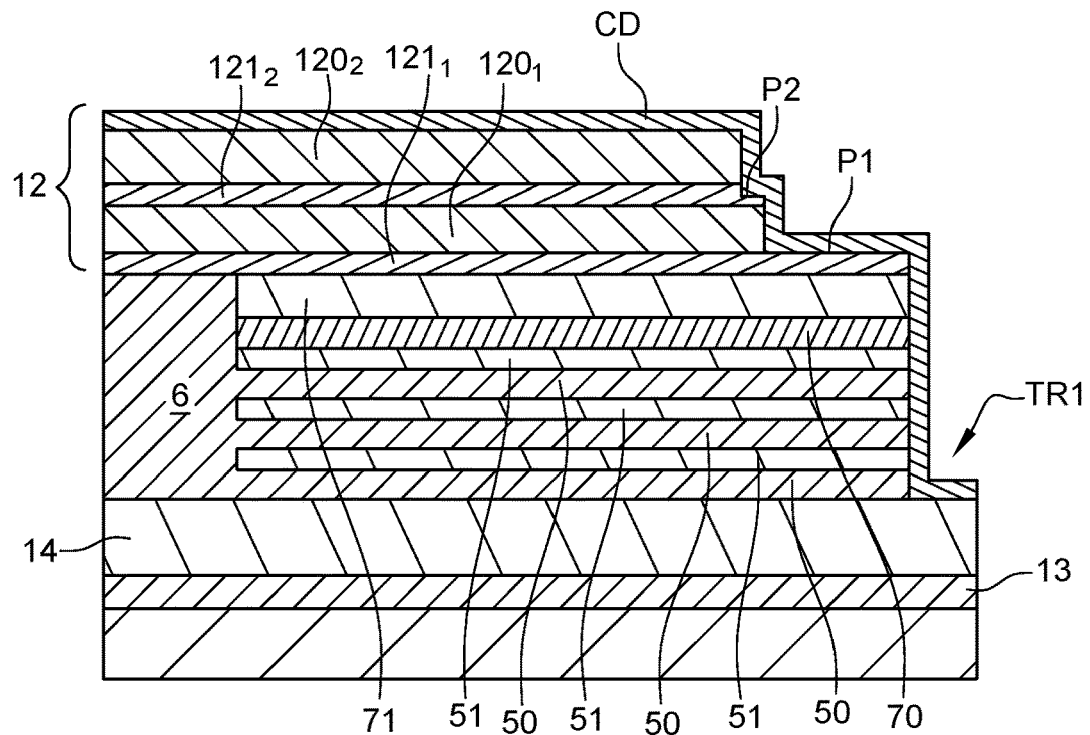

FIG. 10 illustrates a later step of the manufacturing method comprising a deposition of a layer of dielectric material CD so as to cover the first stage P1, the second stage P2, the third stage P3 as well as the bottom and the lateral wall of the first trench TR1.

Figure 11:
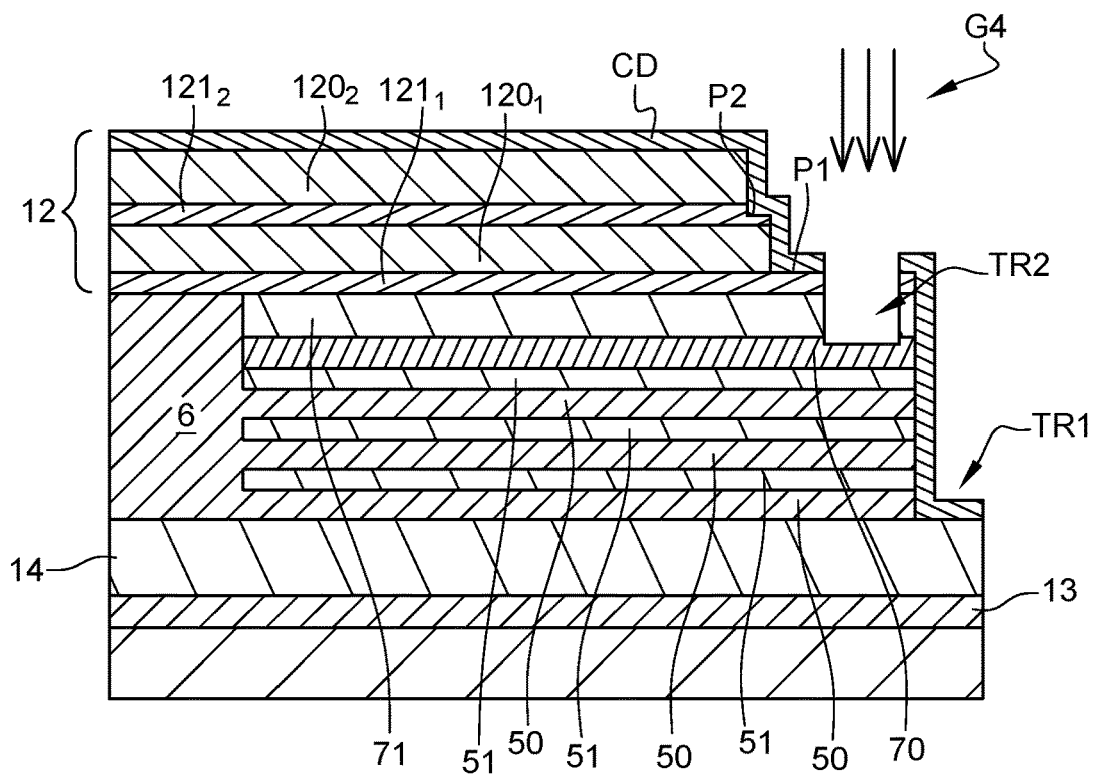

[FIG. 11] Then, as illustrated in FIG. 11, a fourth etching G4 is carried out on a portion of the first stage P1, so as to produce a second trench TR2 extending through the dielectric layer CD down into the first junction layer 70, through the first layer of silicon nitride $121_1$ and the second junction layer 71. The first junction layer 70 may be in part etched, as illustrated by FIG. 11, in order to form later a lateral contact with the two-dimensional electron gas, or the etching may stop on the upper face of the first junction layer 70 to form later a planar contact with the two-dimensional electron gas, such as illustrated by FIGS. 4 to 7.

Figure 12:
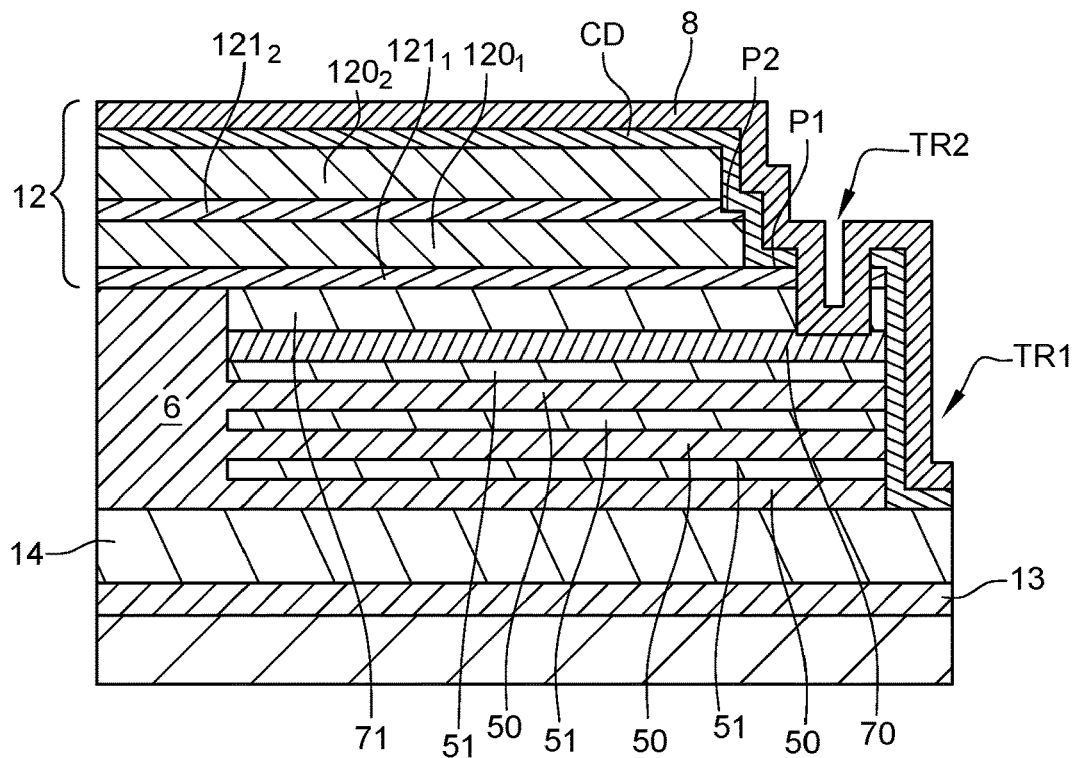

[FIG. 12] The electrically conductive layer 8 is next deposited (FIG. 12) so that the first portion 80 covers the lateral wall of the first trench, that the second U-shaped portion 81 covers the lateral wall of the second trench TR2 thus forming the first Schottky contact 82, and that the horizontal sub-portions $83_1$, $83_2$, $83_3$, cover respectively the first stage P1, the second stage P2 and the third stage P3.

Figure 13:
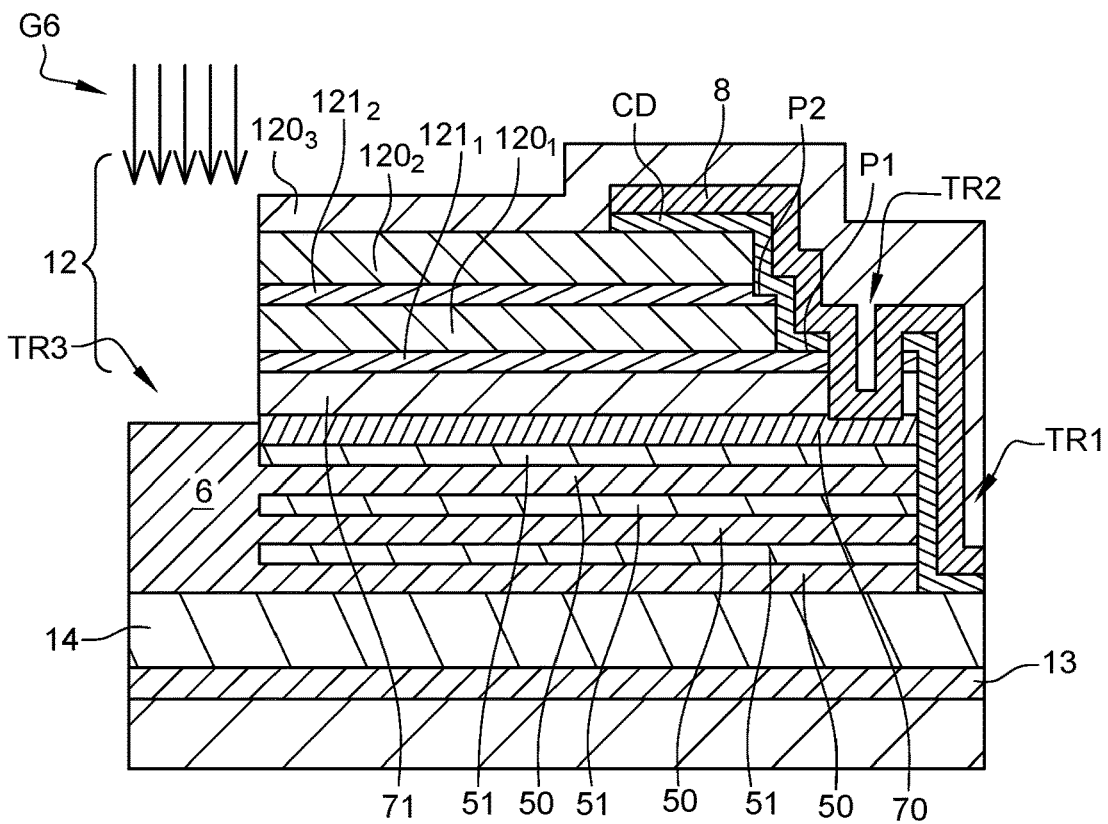

[FIG. 13] During a later step (FIG. 13) of the manufacturing method, a fifth etching is carried out (not represented) of a portion of the dielectric layer CD and the electrically conductive layer 8, then a deposition of a third layer of dielectric material is carried out, here the third layer of TEOS $120_3$, and a sixth etching G6 of the interconnection region 12 and a part of the heavily doped semiconductor region 6 is carried out so as to form a third trench TR3 which reveals the heavily doped semiconductor region 6 and the first junction layer 70.

Figure 14:
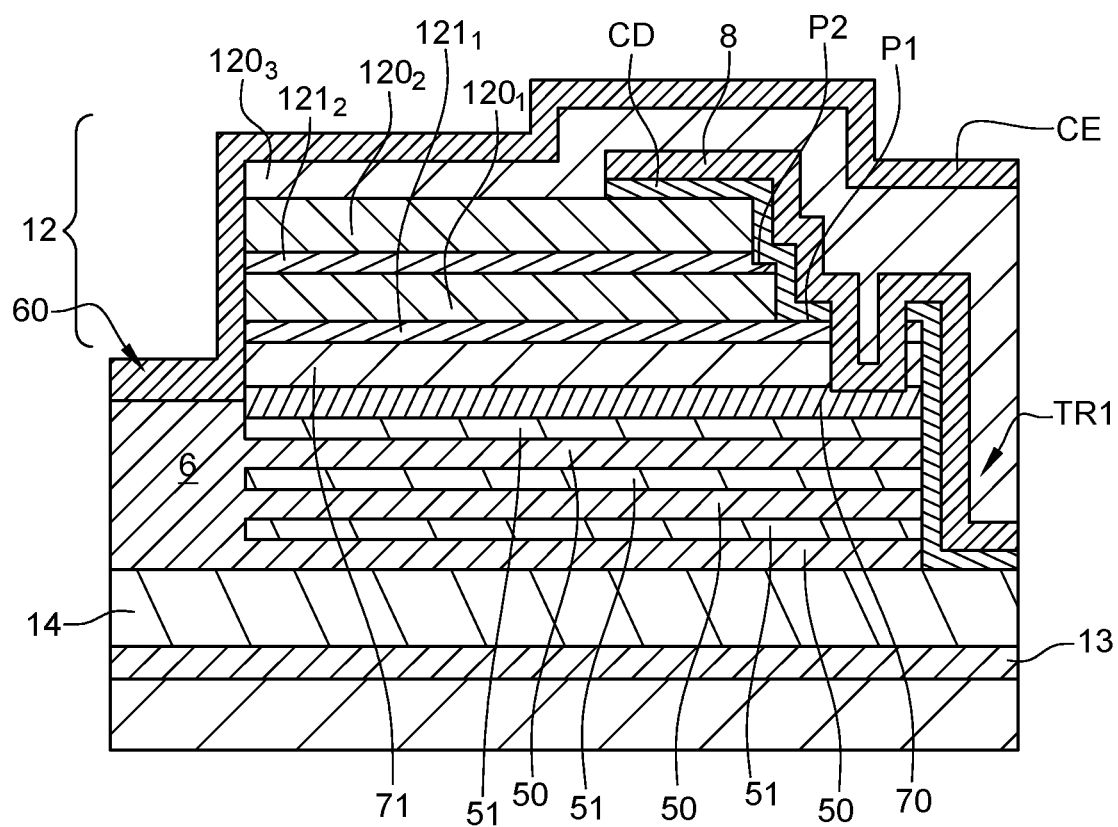

[FIG. 14] A second electrically conductive layer CE, here a metal layer, is next deposited (FIG. 14) so as to cover notably the bottom of the third trench TR3 and thus form the second ohmic contact 60.

The manufacturing method is next finished so as to obtain the device illustrated by FIG. 4 and described previously, by the etching of a portion of the second electrically conductive layer CE (delimitation of the cathode), the deposition of a layer of dielectric material, here the fourth layer of TEOS $120_4$, and by the production of two disjointed portions of a third electrically conductive layer making it possible to establish an electrical connection between the first Schottky contact 82 and the interconnection region 12 and between the second ohmic contact 60 and the interconnection region 12.

The invention claimed is:

1. An integrated electronic device comprising:
   a Schottky diode comprising an anode and a cathode mutually coupled by a two-dimensional electron gas and having a first threshold voltage,
   a derivation component having a second threshold voltage greater than the first threshold voltage and coupled in parallel with the Schottky diode,
   wherein the derivation component is a lateral super-junction transistor comprising a super-junction, an insulated vertical gate, a source electrically connected to the anode of the Schottky diode and a drain electrically connected to the cathode of the Schottky diode, the insulated vertical gate and the source being mutually electrically coupled so as to be at the same electrical potential, and
   wherein the super-junction comprises a vertical stack of an alternation of semiconductor layers of the first conductivity type and of semiconductor layers of a second conductivity type opposite to the first conductivity type.

2. The device according to claim 1, comprising an electrically conductive layer, the insulated vertical gate comprising a first vertical portion of the electrically conductive layer, said first portion being electrically insulated from the super-junction by a dielectric layer, the source of the transistor comprising a second portion of said electrically conductive layer.

3. The device according to claim 2, wherein the anode of the Schottky diode comprises the second portion of the electrically conductive layer.

4. The device according to claim 2, wherein the device comprises a heterojunction arranged on the super-junction and comprising a first junction layer and a second junction layer, the two-dimensional electron gas being formed at the interface between the first junction layer and the second junction layer.

5. The device according to claim 4, wherein the second portion of the electrically conductive layer forms a Schottky contact with the two-dimensional electron gas, at a distance from the ends of the first junction layer.

6. The device according to claim 2, comprising at least one field plate comprising a horizontal portion of the electrically conductive layer.

7. The device according to claim 1, wherein the drain of the transistor comprising a heavily doped semiconductor region of a first conductivity type, the layers of the first conductivity type and of the second conductivity type extending horizontally from the heavily doped semiconductor region up to the insulated vertical gate.

8. The device according to claim 7, wherein the super-junction comprises an alternation of five first layers N type doped at a concentration of $4\times10^{18}$ cm$^{-3}$ and of five second layers P type doped at a concentration of $4\times10^{18}$ cm$^{-3}$, the first and second layers each having a thickness equal to 150 nm.

9. The device according to claim 8, wherein the super-junction is arranged on a voltage withstand layer of thickness equal to 3 μm and N type doped at a concentration of $1\times10^{16}$ cm$^{-3}$.

10. The device according to claim 7, wherein the cathode of the Schottky diode comprises an electrically conductive layer in ohmic contact with the heavily doped semiconductor region and the two-dimensional electron gas.

11. The device according to claim 1, further comprising a heterojunction arranged on the super-junction and comprising a first junction layer and a second junction layer, the two-dimensional electron gas being formed at the interface between the first junction layer and the second junction layer.

12. The device according to claim 1, wherein current flows in a same direction in both the Schottky diode and derivation component.

13. A method for manufacturing an integrated electronic device comprising:
   forming a Schottky diode comprising an anode and a cathode mutually coupled by a two-dimensional electron gas, the Schottky diode having a first threshold voltage;
   forming a derivation component having a second threshold voltage greater than the first threshold voltage, the derivation component being a lateral super-junction transistor comprising a super-junction, an insulated vertical gate, a source and a drain, the insulated vertical gate and the source being mutually electrically coupled so as to be at the same electrical potential, and
   carrying out a parallel coupling of the derivation component and the Schottky diode, the source of the transistor being electrically connected to the anode of the Schottky diode and the drain of the transistor being electrically connected to the cathode of the Schottky diode,
   wherein the super-junction comprises a vertical stack of an alternation of semiconductor layers of the first conductivity type and of semiconductor layers of a second conductivity type opposite to the first conductivity type.

14. The method according to claim 13, further comprising:
   producing the super-junction comprising a stack of an alternation of first semiconductor layers of a first conductivity type and of second semiconductor layers of a second conductivity type opposite to the first conductivity type,
   producing a heavily doped semiconductor region of the first conductivity type at a first end of the semiconductor layers,
   producing, on the super-junction, a heterojunction comprising a production of a first junction layer of a first semiconductor material and a production of a second junction layer of a second semiconductor material on the first junction layer, the first and the second materials having different bandgaps so that the two-dimensional electron gas is formed at the interface between the first junction layer and the second junction layer, an insulated vertical gate at a second end of the semiconductor layers, producing the anode of the Schottky diode by a formation of a first Schottky contact with the two-dimensional electron gas so that the first Schottky contact and the insulated vertical gate are mutually electrically coupled, and producing a second ohmic contact with the two-dimensional electron gas and the heavily doped semiconductor region.

15. The method according to claim 14, comprising a deposition of an electrically conductive layer, so that the insulated vertical gate comprises a first portion of the electrically conductive layer and that the first Schottky contact comprises a second portion of the electrically conductive layer.

16. The method according to claim 15, comprising the production of at least one field plate comprising a third horizontal portion of the electrically conductive layer.

17. The method according to claim 13, wherein the lateral super-junction transistor has electron conduction channels distinct from the two-dimensional electron gas of the Schottky diode.

18. The method according to claim 13, wherein the integrated electronic device comprises a heterojunction arranged on the super-junction and comprising a first junction layer and a second junction layer, the two-dimensional electron gas being formed at the interface between the first junction layer and the second junction layer.

19. An integrated electronic device comprising:

a Schottky diode comprising an anode and a cathode mutually coupled by a two-dimensional electron gas and having a first threshold voltage, a derivation component having a second threshold voltage greater than the first threshold voltage and coupled in parallel with the Schottky diode, wherein the derivation component is a lateral super-junction transistor comprising an insulated vertical gate, a source electrically connected to the anode of the Schottky diode and a drain electrically connected to the cathode of the Schottky diode, the insulated vertical gate and the source being mutually electrically coupled so as to be at the same electrical potential, and wherein the lateral super-junction transistor has electron conduction channels distinct from the two-dimensional electron gas of the Schottky diode.

* * * * *